(12) United States Patent
Hwang

(10) Patent No.: US 7,786,423 B2
(45) Date of Patent: Aug. 31, 2010

(54) IMAGE SENSOR AND METHOD FOR MANUFACTURING THE SAME

(75) Inventor: Sun Jae Hwang, Dobong-gu (KR)

(73) Assignee: Dongbu Hitek, Co., Ltd., Seoul (KR)

( * ) Notice: Subject to any disclaimer, the term of this patent is extended or adjusted under 35 U.S.C. 154(b) by 0 days.

(21) Appl. No.: 12/143,971

(22) Filed: Jun. 23, 2008

(65) Prior Publication Data

US 2009/0001257 A1    Jan. 1, 2009

(30) Foreign Application Priority Data

Jun. 26, 2007    (KR)    ................... 10-2007-0062678

(51) Int. Cl.
*H01L 27/00* (2006.01)
*H01L 31/062* (2006.01)
*H01L 21/00* (2006.01)
(52) U.S. Cl. .................. 250/208.1; 257/292; 438/69
(58) Field of Classification Search ............ 250/208.1, 250/226, 216, 214.1; 438/69, 71, 73; 257/184, 257/292, 432; 359/15; 348/335, 340, 360
See application file for complete search history.

(56) References Cited

U.S. PATENT DOCUMENTS 7,312,093 B2 *  12/2007  Ryu ............................ 438/29

2005/0242271 A1 *  11/2005  Weng et al. ............... 250/214.1
2006/0145223 A1    7/2006  Ryu
2007/0148373 A1 *  6/2007  Kim ............................ 428/21

FOREIGN PATENT DOCUMENTS

KR    10-2001-0086542    7/2003
KR    10-0720458 B1    5/2007

* cited by examiner

*Primary Examiner*—Georgia Y Epps
*Assistant Examiner*—Don Williams
(74) *Attorney, Agent, or Firm*—Saliwanchik, Lloyd & Saliwanchik

(57) ABSTRACT

An image sensor is disclosed that can provide a microlens aligned directly above an active area of a substrate. The image sensor can include a substrate having a pixel area. An active region can be formed on the pixel area and can include photodiodes. Metal lines and an interlayer dielectric can be provided on the pixel area of the substrate. A microlens can be formed above the metal lines and interlayer dielectric to be directly aligned with the active area of the pixel area. To achieve such an alignment, an alignment key of the microlens can be aligned with an alignment key of the active region. In one embodiment, the microlens can avoid being formed right above the metal lines.

5 Claims, 5 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0062678, filed on Jun. 26, 2007, which is hereby incorporated by reference in its entirety.

BACKGROUND

In general, a complementary metal oxide semiconductor (CMOS) image sensor (CIS) includes a photodiode and a transistor circuit for each unit pixel. Typically, a number of metal layers and vias are formed above the photodiode and transistor circuit to provide signal and power lines to devices such as the transistor circuit.

According to related arts, metal and via formation processes are performed without considering the light path. Therefore, a misalignment or overlay variation may occur during formation of a microlens. The misalignment or overlay variation can scatter or reflect the incident light. This causes light loss and, thus, the image quality of a product is deteriorated.

Typically, in a photolithography process for the microlens, the microlens is aligned using a top metal layer. This can further aggravate the light scattering/reflection limitation when overlay variation in the metal and via processes occurs.

BRIEF SUMMARY

Embodiments of the present invention provide an image sensor and a method for manufacturing the same, which can improve optical efficiency of the image sensor. In one aspect, the overlay between metal layers and a microlens can be managed using a microlens aligning method according to an embodiment of the present invention.

An image sensor according to an embodiment can include a substrate having a pixel area, a metal line formed above the pixel area of the substrate, and a microlens formed above the metal line, wherein the microlens is formed aligned above an active area of the pixel area. An alignment key can be provided for the alignment of the microlens with the active area.

A method for manufacturing an image sensor according to an embodiment can include providing a substrate having a pixel area; forming an interlayer dielectric and a metal line on the substrate; and forming a microlens above the metal line and aligned to an active area of the pixel area.

The details of one or more embodiments are set forth in the accompanying drawings and the description below. Other features will be apparent from the description and drawings, and from the claims.

DETAILED DESCRIPTION

Reference will now be made in detail to the embodiments of the present disclosure, examples of which are illustrated in the accompanying drawings.

In the following description, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
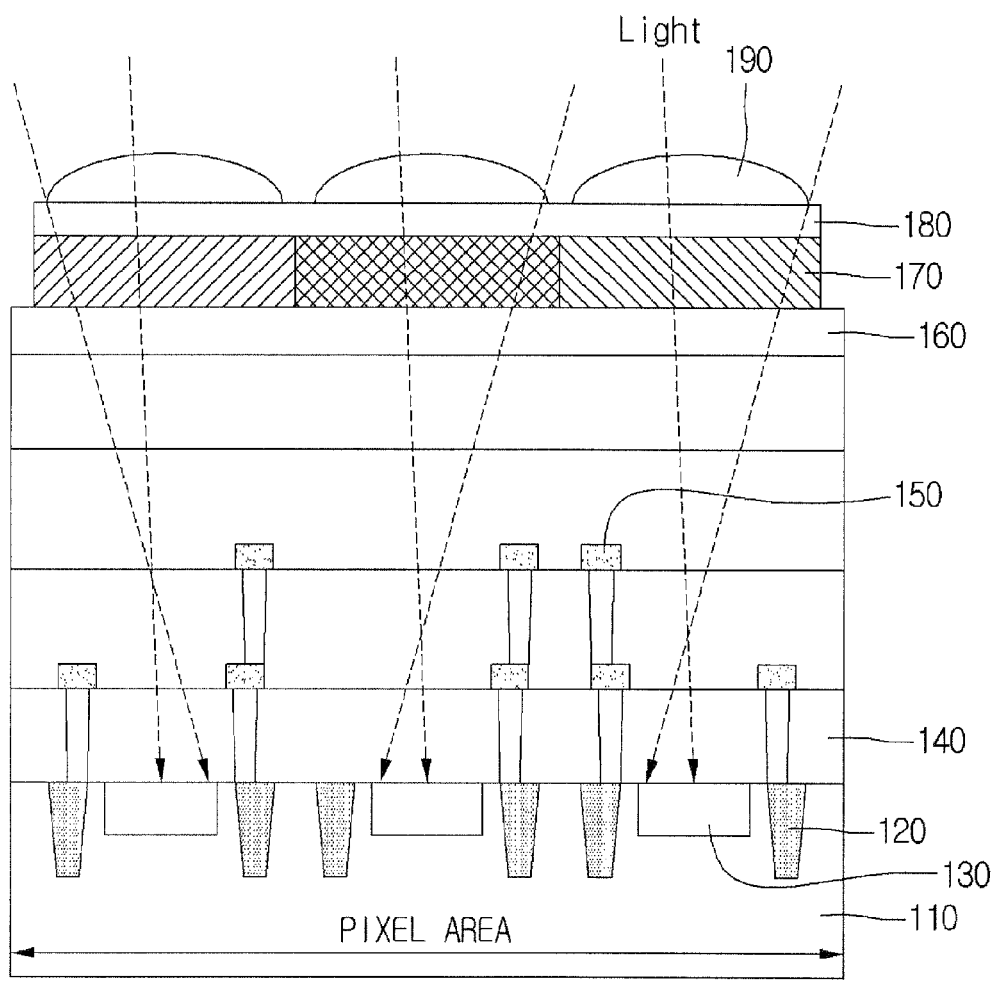
FIG. 1 is a cross-sectional view of an image sensor according to an embodiment of the present invention.

Referring to FIG. 1, an image sensor according to one embodiment can include a device isolation layer 120 on a substrate 110. The device isolation layer 120 can be, for example, a shallow trench isolation. Of course, embodiments are not limited thereto.

Photodiodes 130 can be provided at a pixel area of the substrate 110. A variety of transistors (not shown) can be formed at sides of the photodiodes 130.

The image sensor can be classified as a 1Tr type, 2Tr type, 3Tr type, 4Tr type, 5Tr type, and the like, according to the number of the transistors formed for each unit pixel. For example, the 3Tr type image sensor includes one photodiode and three transistors (a reset transistor, a drive transistor, and a select transistor), and the 4Tr type image sensor includes one photodiode and four transistors (a transfer transistor, a reset transistor, a drive transistor, and a select transistor).

An interlayer dielectric 140 can be formed on an entire surface of the substrate 110 on which the photodiodes 130 and the transistor(s) (not shown) are formed.

The interlayer dielectric 140 can be a multi-layer. For example, a first interlayer dielectric can be formed, a light interception layer (not shown) for inhibiting light incident a region not corresponding to the photodiode 130 can be formed on the first interlayer dielectric, and then a second interlayer dielectric can be formed on the resulting structure.

Metal lines 150 can be formed on the interlayer dielectric 140. The metal lines 150 can be formed in multiple layers.

Then, a passivation layer 160 for protecting the device from moisture or scratch can be formed.

In a further embodiment, a color filter layer 170 can be formed. In one embodiment, the color filter layer 170 can be formed by applying a dyeable resist on the interlayer dielectric 140 and performing exposure and developing processes. The color filter layer 170 can include red, green, and blue filters for filtering light having specific wavelength bands.

If desired, a planarization layer 180 can be formed on the color filter layer 170. The planarization layer 180 can be used to provide a focus length adjusting layer and a flat surface for a lens layer.

Then, microlenses 190 can be formed.

According to an embodiment, the microlenses 190 can be formed aligned directly above an active area of the pixel area.

In one embodiment, the microlenses 190 can be formed aligned directly above the photodiodes 130 in the active area.

Further, the microlenses 190 can be formed so as to not be formed right above the metal lines 150.

Additionally, the microlenses 190 may not be formed right above a top metal (not shown).

Figure 2A:
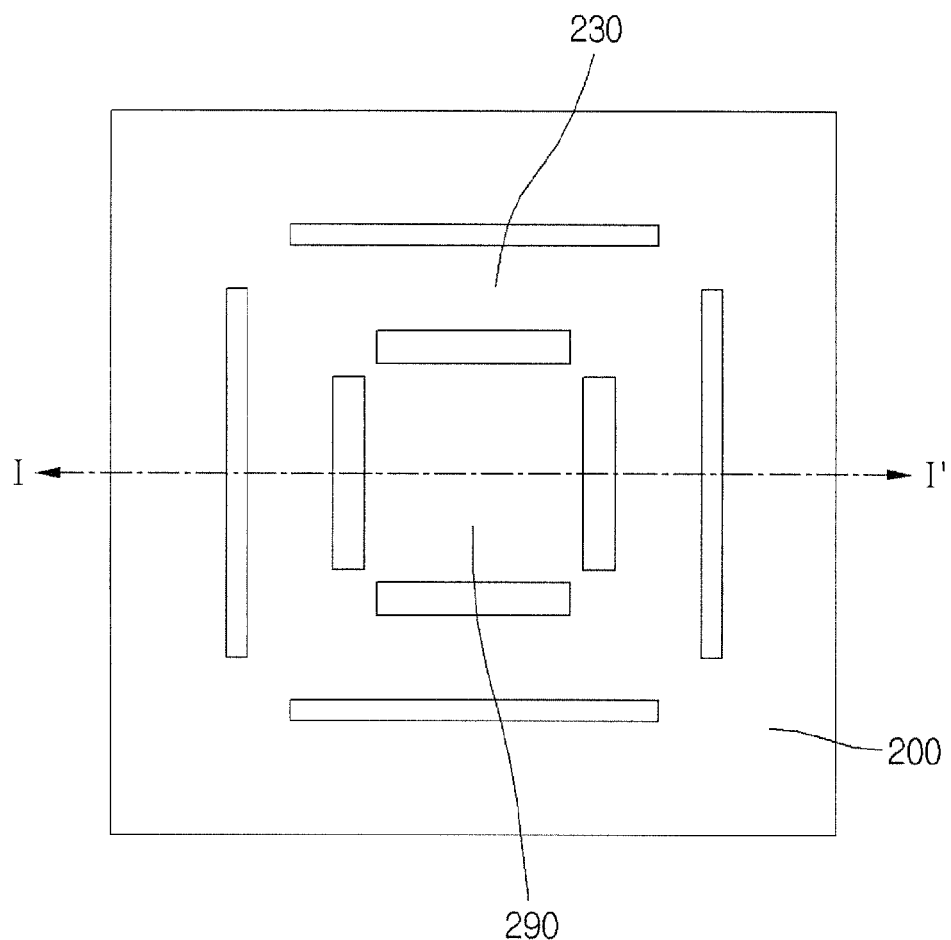
FIGS. 2A and 2B show a top plan and a cross-sectional view, respectively, of an alignment key in a method for manufacturing an image sensor according to an embodiment of the present invention.
Figure 2B:
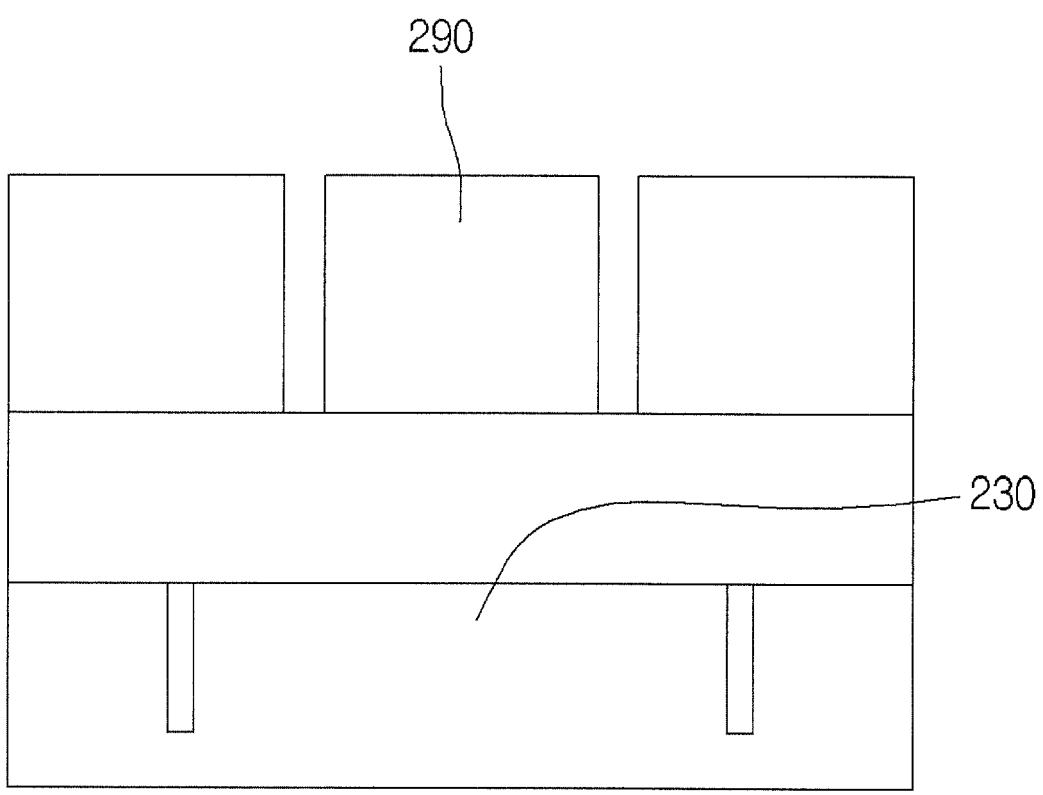

FIGS. 2A and 2B illustrate an embodiment of an alignment key for use in a method for manufacturing the image sensor according to an embodiment.

Referring to FIGS. 2A and 2B, in order to form the microlenses 190 aligned directly above the active area of the pixel area, an alignment key 290 of the microlenses 190 is aligned with an alignment key 230 for the active area of the pixel area.

For example, in one embodiment, in order to form the microlenses 190 aligned directly above the active area of the pixel area, the alignment key 290 of the microlenses 190 can be aligned with an alignment key 230 for the photodiodes in the active area.

In embodiments of the present invention, unlike the related art, in order to always form the microlenses 190 right above the active area of the pixel area, the alignment key 290 of the microlenses 190 is not aligned with the alignment key of the metal lines (not shown).

For example, the alignment key 290 of the microlenses is not aligned with the alignment key of the top metal layer.

In a photolithography process, the overlay tends to vary. Accordingly, there is a managing range for the overlay variation. Unlike other devices having a purpose of electron-pass, a metal structure in a CMOS image sensor affects the transfer of the light and thus a geometrical arrangement of a metal and via must be considered in the photolithography process.

A back end of line (BEOL) process, according to an embodiment of the present invention, can include formation of three metal line layers (M1, M2, top metal) and their interconnects (M1C, M2C, M3C).

When the overlay specifications of the M1C, M1, M2C, M2, and M3C, and top metal are enhanced, optimal optical efficiency can be obtained. In addition, an overlay margin increases for subsequent processes.

In addition, according to embodiments of the present invention, image failure can be minimized by directly aligning the alignment key 290 of the microlenses on the alignment key 230 of the active area (i.e., the photodiode) even when there is a misoverlay on a lower layer. When the overlay specification is further managed, the optical efficiency can be further improved.

Figure 3A:
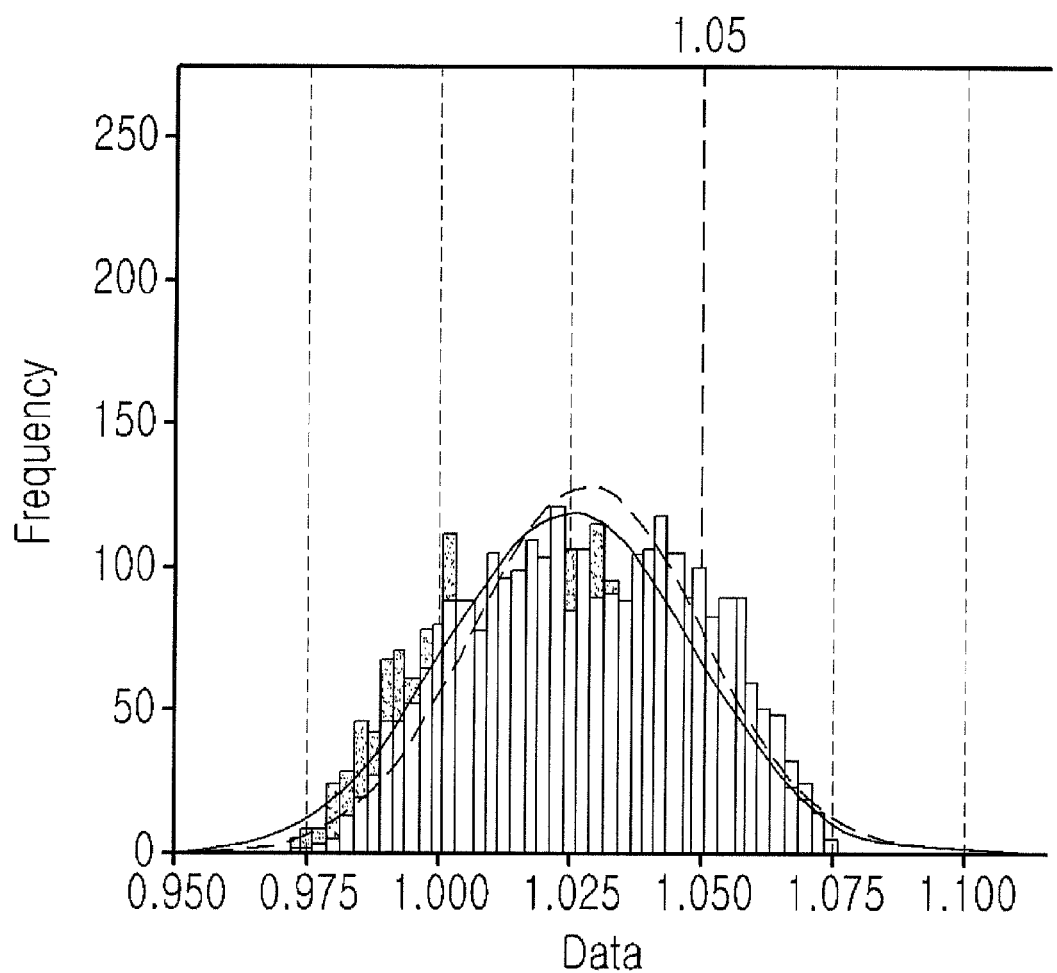
FIG. 3A shows a histogram of color difference dispersion of a test example of an image sensor having conventionally aligned microlenses.
Figure 3B:
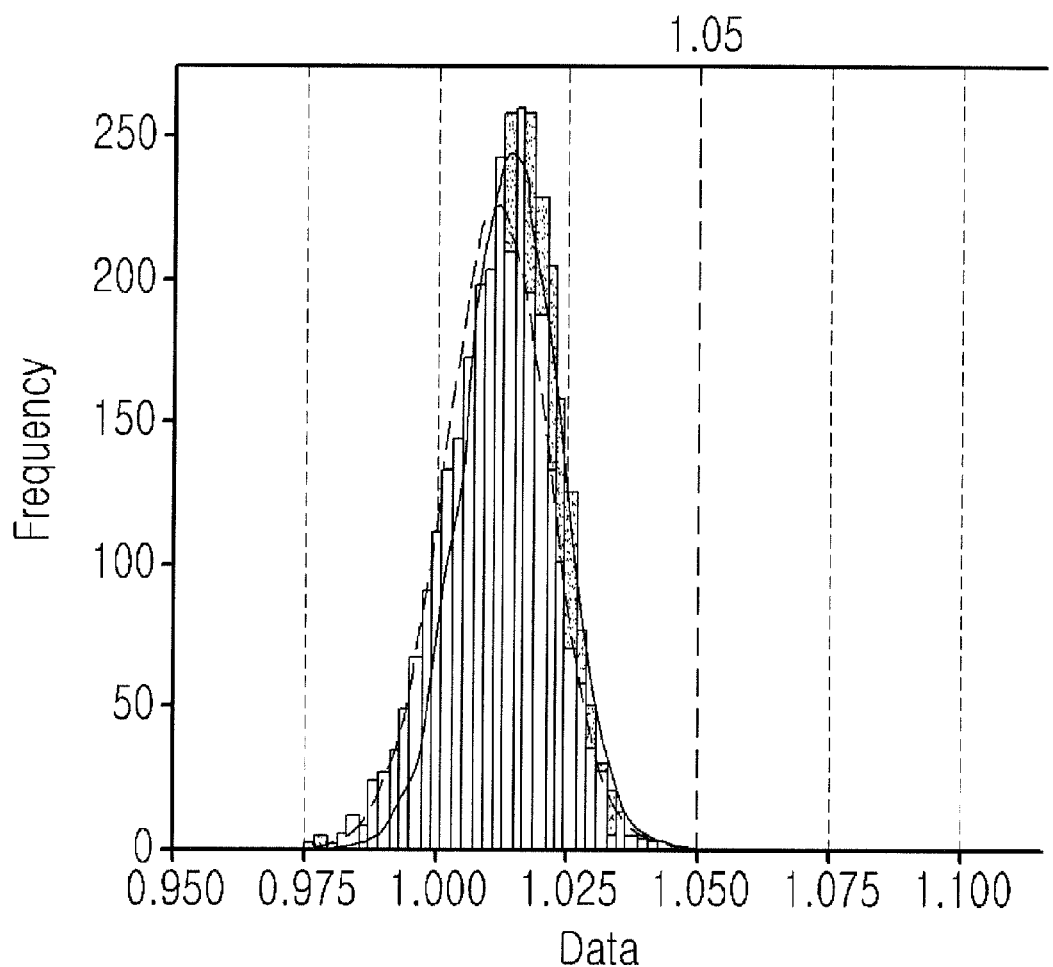
FIG. 3B shows a histogram of color difference dispersion of a test example of an image sensor having microlenses aligned according to an embodiment.

FIG. 3A illustrates a test example of an image sensor according to the related art and FIG. 3B illustrates a test example of an image sensor having a microlens aligned according to an embodiment of the present invention.

That is, FIGS. 3A and 3B are histograms of a color difference in accordance with an alignment method of the microlenses.

FIG. 3A illustrates a color difference dispersion when the microlenses are aligned on the top metal in accordance with the related art.

Referring to FIG. 3A, there are a lot of samples each having a central value of 1.025 and a standard specification over 1.05. At this point, a defect rate is 16.8%. A module level test result is similar to a wafer level test result.

FIG. 3B illustrates a color difference dispersion when the microlenses are directly aligned at the active area in accordance with an embodiment.

Referring to FIG. 3B, it can be noted that the central value is 1.01, which can be approximated to an ideal level of 1, and the dispersion is shown to be 0.075. By comparison to FIG. 3A, it can be noted that the color difference is significantly improved by aligning the microlenses according to an embodiment of the present invention. At this point, the defect rate is 0%. That is, the color difference property is significantly improved. In addition, the module level test result is similar to this result.

As illustrated by the tests, when the microlenses are aligned at the active area, the color difference property can be effectively improved.

The image sensor and the method for manufacturing the same according to embodiments can minimize light loss by directly aligning the microlenses to the active area. In addition, the optimal optical efficiency can be realized by performing the management of the overlay.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
   providing a substrate having a pixel area comprising an active area formed at the pixel area;
   forming an interlayer dielectric and a metal line on the pixel area are of the substrate; and
   forming a microlens above the interlayer dielectric and the metal line by aligning the microlens to the active area of the pixel area,
   wherein the forming of the microlens comprises aligning an alignment key of the microlens with an alignment key of the active area of the pixel area.

2. The method according to claim 1, wherein the alignment key of the microlens is directly aligned on the alignment key of the active area, minimizing an image failure.

3. The method according to claim 1, further comprising forming a photodiode at the active area, wherein the aligning of the alignment key of the microlens with the alignment key of the active area of the pixel area comprises aligning an alignment key of the microlens with an alignment key of the photodiode.

4. The method according to claim 3, wherein the alignment key of the microlens is directly aligned on the alignment key of the photodiode, minimizing an image failure.

5. The method according to claim 1, further comprising forming a top metal on the substrate before forming the microlens.

* * * * *